(12) United States Patent
Lee et al.

(10) Patent No.: US 8,194,479 B2
(45) Date of Patent: Jun. 5, 2012

(54) SEMICONDUCTOR MEMORY DEVICE HAVING A SKEW SIGNAL GENERATOR FOR ADJUSTING A DELAY INTERVAL OF INTERNAL CIRCUITRY

(75) Inventors: Kyoung Youn Lee, Yeosu-si (KR); Ho Uk Song, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 856 days.

(21) Appl. No.: 12/150,403

(22) Filed: Apr. 28, 2008

(65) Prior Publication Data
US 2009/0167415 A1  Jul. 2, 2009

(30) Foreign Application Priority Data
Dec. 28, 2007  (KR) ................ 10-2007-0141052

(51) Int. Cl.
*G11C 7/00* (2006.01)

(52) U.S. Cl. ..... 365/194; 365/191; 365/201; 365/225.7; 327/394; 327/393; 327/277; 327/278

(58) Field of Classification Search ............ 365/194, 365/191, 201, 225.7; 327/394, 393, 392, 327/277, 278, 276, 525
See application file for complete search history.

(56) References Cited

U.S. PATENT DOCUMENTS

| 6,590,434 B2 * | 7/2003 | Chung et al. ........... 327/277 |
| 7,622,973 B2 * | 11/2009 | Kim et al. ............. 327/172 |
| 2006/0198214 A1 * | 9/2006 | Kim et al. ........... 365/200 |
| 2008/0043548 A1 | 2/2008 | Jung et al. |
| 2009/0167415 A1 * | 7/2009 | Lee et al. ............. 327/525 |

FOREIGN PATENT DOCUMENTS

| KR | 10-2003-0003856 A | 1/2003 |
| KR | 10-2005-0028076 A | 3/2005 |
| KR | 10-2005-0093217 A | 9/2005 |

* cited by examiner

*Primary Examiner* — Andrew Q Tran
(74) *Attorney, Agent, or Firm* — John P. White; Cooper & Dunham LLP

(57) ABSTRACT

A skew signal generator is provided which comprises a fuse signal generating unit for generating a plurality of fuse signals, and an encoder for generating skew signals including skew information of a wafer by encoding the fuse signals.

9 Claims, 3 Drawing Sheets

SEMICONDUCTOR MEMORY DEVICE HAVING A SKEW SIGNAL GENERATOR FOR ADJUSTING A DELAY INTERVAL OF INTERNAL CIRCUITRY

BACKGROUND

The present disclosure relates to a semiconductor memory device. More particularly, the present disclosure relates to a skew signal generator capable of generating a skew signal from a fuse signal that is set according to skew states of a wafer such that the skew signal can be used for determining a delay interval of a delay circuit included in a semiconductor memory device.

As a semiconductor device is gradually scaled down, property variation in performance of a transistor is increased according to a skew and the temperature. This is because it is difficult to control a process and a device variable determining the properties of a transistor as a semiconductor device is gradually scaled down. For example, a manufacturing process and a device variable may comprise the width and length of a transistor gate, the thickness of a gate oxide, a sheet resistance and the like. As such variables have lower target values, errors in the target value are increased in respective processes. Thus, property variation in performance of a transistor is increased.

A skew is classified into SLOW, TYPICAL and FAST. The SLOW denotes a state in which a transistor has a low current driving force, and the FAST denotes a state in which a transistor has a high current driving force. The TYPICAL denotes a state in which a transistor has a current driving force higher than that in the SLOW, and has a current driving force lower than that in the FAST. It is preferred to design a circuit in a semiconductor device such that the circuit can operate regardless of property variation in performance of a transistor caused by such a skew.

FIG. 1 is a block diagram illustrating a $V_{ref}$ generating unit 1 according to the prior art.

As illustrated in FIG. 1, the $V_{ref}$ generating unit 1 is connected to external voltage terminals VDDs through a plurality of fuses F1 to FN to adjust the level of reference voltage $V_{ref}$. That is, the $V_{ref}$ generating unit 1 receives external voltage through the N external voltage supply terminals VDDs to generate the reference voltage $V_{ref}$. The number of the external voltage supply terminals VDDs is adjusted by cutting a part of the fuses F1 to FN, so that the driving force of the $V_{ref}$ generating unit 1 can be adjusted. Whether to cut the fuses F1 to FN is adjusted by a skew. For example, when a skew is determined as SLOW according to a test result of a wafer, voltage is sufficiently supplied to the $V_{ref}$ generating unit 1 without cutting all the fuses F1 to FN because transistors included in the $V_{ref}$ generating unit 1 have a low current driving force. Further, when the skew is determined as FAST, external voltage supplied to the $V_{ref}$ generating unit 1 is decreased by partially or completely cutting the fuses F1 to FN because transistors included in the $V_{ref}$ generating unit 1 have a high current driving force. As described above, the level of the reference voltage $V_{ref}$ is adjusted according to whether to cut the fuses F1 to FN, so that the reference voltage $V_{ref}$ having a predetermined level can be generated regardless of the skew.

In general, an internal circuit of a semiconductor memory device is designed without paying thoughtful attention to the skew. That is, if a wafer is output, product development parts test the wafer under various conditions to determine the skew, and adjust the level of an output signal output from the internal circuit by cutting fuses based on information regarding the determined skew.

However, since cutting the fuses according to the skew is individually performed relative to respective internal circuits, limitations exist in applying skew property to all internal circuits.

SUMMARY

In an aspect of the present invention, a skew signal generator and a semiconductor memory device using the same are provided which can reduce variation of an internal circuit due to a skew by applying skew information, which is obtained from a fuse cut according to the skew, to the internal circuit of a semiconductor memory device.

In an embodiment, a skew signal generator comprises a fuse signal generating unit for generating a plurality of fuse signals and an encoder for generating skew signals including skew information of a wafer by encoding the fuse signals.

The fuse signal generating unit can comprise a first fuse connected between a supply voltage terminal and a first node, and a second fuse connected between the supply voltage terminal and a second node.

Preferably, a first fuse signal, which is enabled according to whether the first fuse is cut, is output to the first node, and a second fuse signal, which is enabled according to whether the second fuse is cut, is output to the second node.

Preferably, the first and second fuses are cut according to the skew information obtained through a wafer test.

Preferably, the encoder receives the fuse signals to generate first to third skew signals enabled according to a number of signals enabled among the fuse signals.

In another embodiment, a semiconductor memory device comprises a skew signal generator for generating skew signals including skew information of a wafer based on fuse signals generated from a plurality of fuses, and a delay circuit for adjusting a delay interval in response to the skew signals.

In another aspect, the delay circuit comprises, a first delay unit for delaying an input signal by a first delay interval, a second delay unit for delaying the input signal by a second delay interval, a third delay unit for delaying the input signal by a third delay interval, a first transfer unit for transferring an output signal of the first delay unit in response to the first skew signal, a second transfer unit for transferring an output signal of the second delay unit in response to the second skew signal; and a third transfer unit for transferring an output signal of the third delay unit in response to the third skew signal.

Preferably, the first to third delay units comprise an inverter chain, respectively.

Preferably, the first delay interval is shorter than the second delay interval and the second delay interval is shorter than the third delay interval.

Preferably, the first to third transfer units comprise a transfer gate, respectively.

BRIEF DESCRIPTION OF THE DRAWINGS

The above and other features and advantages of the present invention will be more apparent from the following detailed description taken in conjunction with the accompanying drawings, in which.

DESCRIPTION OF SPECIFIC EMBODIMENTS

Hereinafter, examples and embodiments of the present invention will be described with reference to the accompanying drawings. The examples and embodiments are for illustrative purposes only and the scope of the present invention is not limited to the examples and embodiments.

Figure 1:
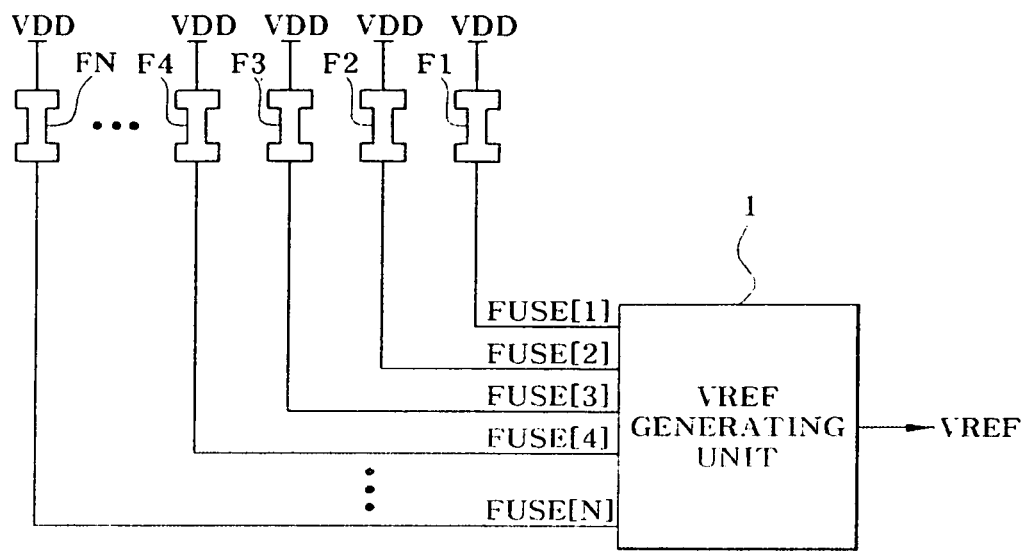
FIG. 1 is a block diagram illustrating a conventional $V_{ref}$ generating unit.
Figure 2:
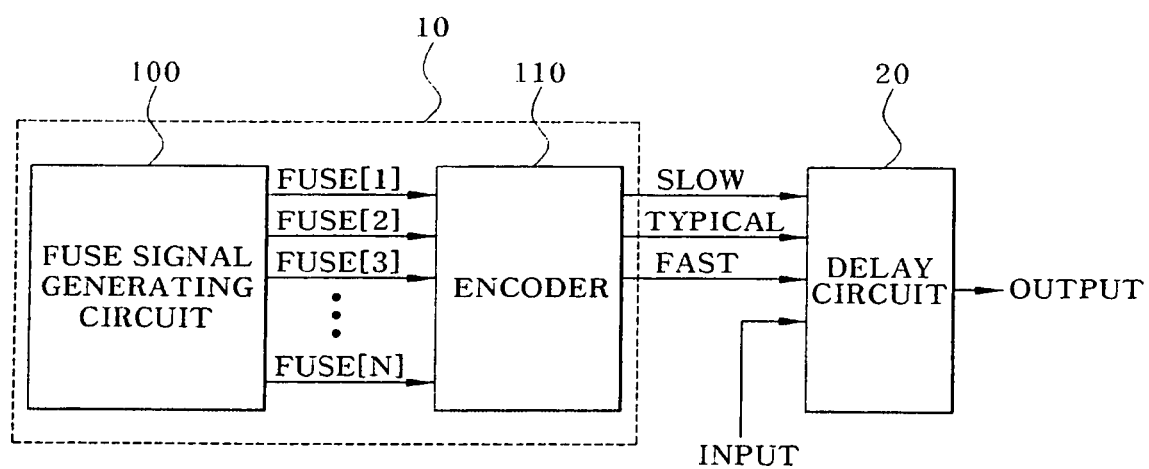
FIG. 2 is a block diagram illustrating the construction of a semiconductor memory device for adjusting a delay interval of a delay circuit by using a skew signal, according to an embodiment of the present invention.
Figure 3:
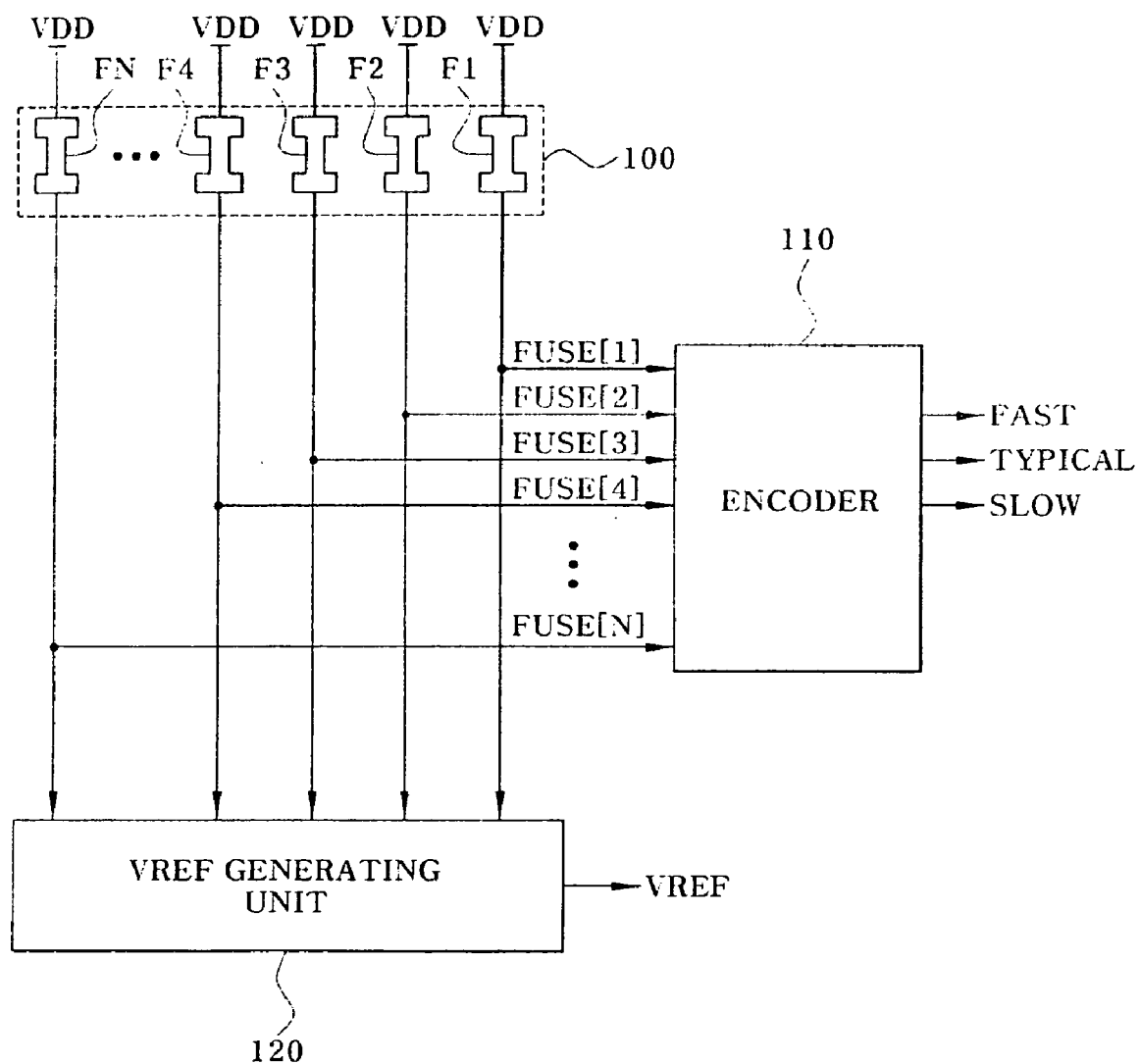
FIG. 3 is a detailed block diagram illustrating the construction of a skew signal generator included in the semiconductor memory device of FIG. 2.
Figure 4:
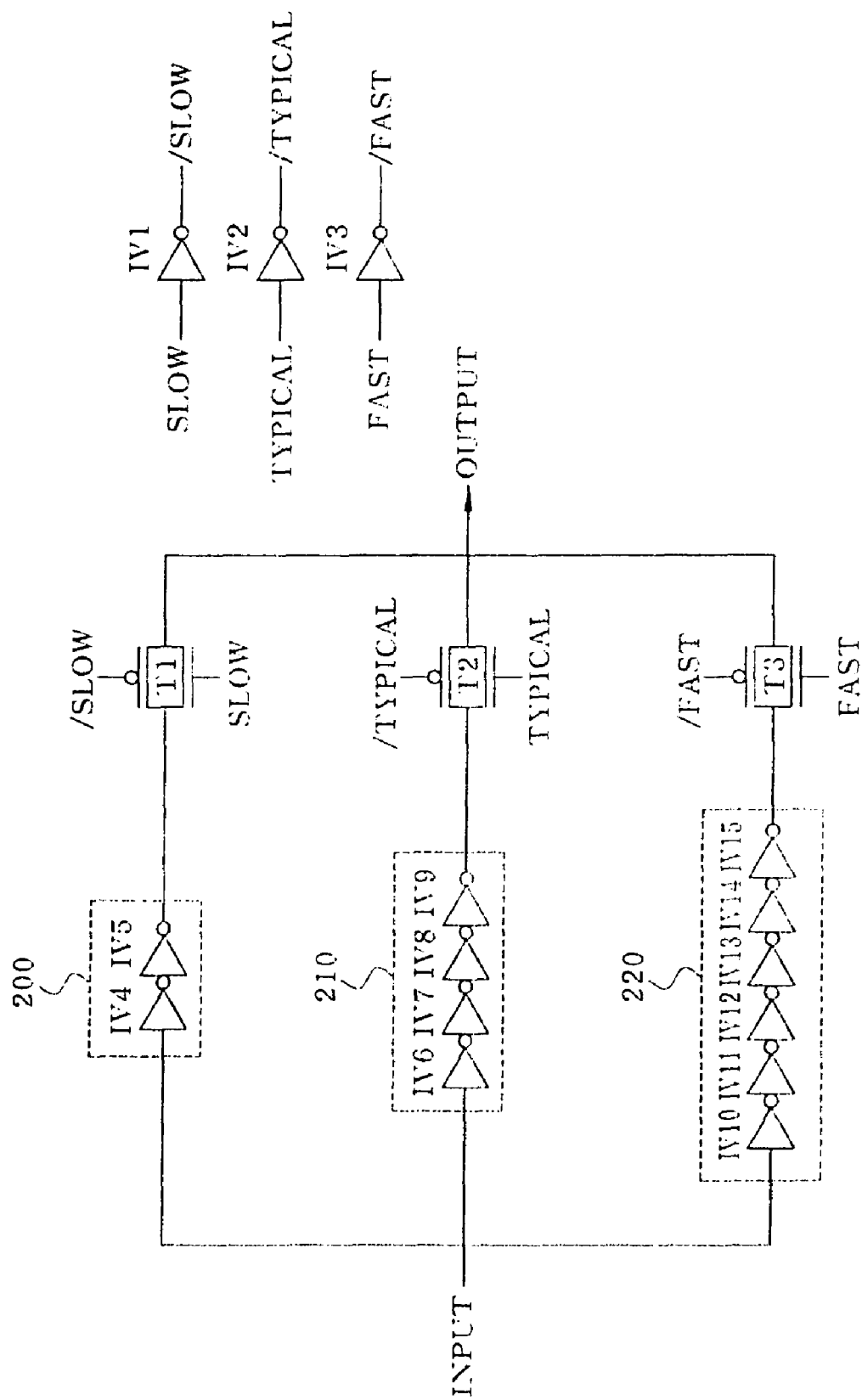
FIG. 4 is a circuit diagram illustrating the construction of a delay circuit included in the semiconductor memory device of FIG. 2.

FIG. 2 is a block diagram illustrating the construction of a semiconductor memory device for adjusting a delay interval of a delay circuit by using a skew signal according to an embodiment of the present invention, FIG. 3 is a detailed block diagram illustrating the construction of a skew signal generator included in the semiconductor memory device of FIG. 2, and FIG. 4 is a circuit diagram illustrating the construction of a delay circuit included in the semiconductor memory device of FIG. 2.

As illustrated in FIG. 2, the semiconductor memory device according to an embodiment of the present invention comprises a skew signal generator 10 and a delay circuit 20.

The skew signal generator 10 comprises a fuse signal generating circuit 100 and an encoder 110. The fuse signal generating circuit 100 comprises N fuses cut according to a skew to generate first to $N^{th}$ fuse signals FUSE[1:N]. The encoder 110 receives the first to $N^{th}$ fuse signals FUSE[1:N] to generate a first skew signal SLOW, a second skew signal TYPICAL and a third skew signal FAST.

Referring in more detail to FIG. 3, the fuse signal generating circuit 100 comprises a first fuse F1 connected between an external voltage supply terminal VDD and an output terminal of a first fuse signal FUSE[1], a second fuse F2 connected between the external voltage supply terminal VDD and an output terminal of a second fuse signal FUSE[2], a third fuse F3 connected between the external voltage supply terminal VDD and an output terminal of a third fuse signal FUSE[3], a fourth fuse F4 connected between the external voltage supply terminal VDD and an output terminal of a fourth fuse signal FUSE[4], and an $N^{th}$ fuse FN connected between the external voltage supply terminal VDD and an output terminal of an $N^{th}$ fuse signal FUSE[N]. Whether to cut the first to $N^{th}$ fuses F1 to FN is determined based on skew information obtained through a wafer test.

That is, when the skew is determined as SLOW, the number of fuses cut among the first to $N^{th}$ fuses F1 to FN is minimally set because a transistor included in the semiconductor memory device has a low current driving force. When the skew is determined as FAST, the number of fuses cut among the first to $N^{th}$ fuses F1 to FN is maximally set because the transistor included in the semiconductor memory device has a high current driving force.

The number of fuses cut according to the skew is determined based on variation of an internal circuit according to the skew. For example, a $V_{ref}$ generating unit 120 connected to the first to $N^{th}$ fuses F1 to FN to receive external voltage is configured to generate constant reference voltage $V_{ref}$ regardless of the skew. Accordingly, the $V_{ref}$ generating unit 120 determines whether to cut the first to $N^{th}$ fuses F1 to FN in order to generate the constant reference voltage $V_{ref}$ regardless of the skew. That is, when the skew is determined as SLOW, the number of cut fuses is minimally set because the level of the reference voltage $V_{ref}$ generated by the $V_{ref}$ generating unit 120 is decreased. Further, when the skew is determined as FAST, the number of cut fuses is maximally set because the level of the reference voltage $V_{ref}$ generated by the $V_{ref}$ generating unit 120 is increased.

The encoder 110 is prepared in the form of a general encoder circuit to generate the first to third skew signals SLOW, TYPICAL and FAST that are enabled according to the number of signals enabled into a high level among the first to $N^{th}$ fuse signals FUSE[1:N]. For example, when it is assumed that 10 fuse signals exist, if nine or more fuse signals are at a high level, only the first skew signal SLOW may be enabled into a high level because the internal circuit has a low current driving force. If only less than three fuse signals are at a high level, only the third skew signal FAST may be enabled into a high level because the internal circuit has a high current driving force. If three to eight fuse signals are at a high level, only the second skew signal TYPICAL may be enabled into a high level. The encoder 110 can be prepared in the form of various circuits according to the number of fuse signals that enable the first to third skew signals SLOW, TYPICAL and FAST.

Referring to FIG. 4, the delay circuit 20 comprises a first delay unit 200, a second delay unit 210, a third delay unit 220, a first transfer gate T1, a second transfer gate T2 and a third transfer gate T3. The first delay unit 200 delays an input signal INPUT by a first delay interval, the second delay unit 210 delays the input signal INPUT by a second delay interval, and the third delay unit 220 delays the input signal INPUT by a third delay interval. The first transfer gate T1 transfers output of the first delay unit 200 as an output signal OUTPUT in response to the first skew signal SLOW. The second transfer gate T2 transfers output of the second delay unit 210 as the output signal OUTPUT in response to the second skew signal TYPICAL. The third transfer gate T3 transfers output of the third delay unit 220 as the output signal OUTPUT in response to the third skew signal FAST. The first to third delay units 200, 210 and 220 comprise respective inverter chains. Preferably, the first delay unit 200 has the shortest delay interval and the third delay unit 220 has the longest delay interval.

Hereinafter, an operation of the semiconductor memory device having the construction as described above will be described. The skew signal generator 10 comprises the first to tenth fuses F1 to F10. When the skew is determined as SLOW according to a test result of a wafer, the ninth and tenth fuses F9 and F10 of the fuses F1 to F10 are cut. When the skew is determined as TYPICAL, the fifth to tenth fuses F5 to F10 are cut. When the skew is determined as FAST, the third to tenth fuses F3 to F10 are cut.

In a case in which the ninth and tenth fuses F9 and F10 are cut, the fuse signal generating circuit 100 generates the first to eighth fuse signals FUSE[1:8] at a high level and the ninth and tenth fuse signals FUSE[9:10] at a low level. The encoder 110 receives the first to tenth fuse signals FUSE[1:10] to generate the first skew signal SLOW at a high level and the second and third skew signals TYPICAL and FAST at a low level. The first skew signal SLOW is enabled into a high level when nine or more signals of the fifth to tenth fuse signals FUSE[1:10] are at a high level.

The first skew signal SLOW at a high level turns on the first transfer gate T1 of the delay circuit 20, and the second and third skew signals TYPICAL and FAST at a low level turn off the second and third transfer gates T2 and T3 of the delay circuit 20. Accordingly, the input signal INPUT inputted to the delay circuit 20 is delayed by the delay interval of the first delay unit 200, and then outputted as the output signal OUTPUT.

In a case in which the fifth to tenth fuses F5 to F10 are cut, the fuse signal generating circuit 100 generates the first to fourth fuse signals FUSE[1:4] at a high level and the fifth to tenth fuse signals FUSE[5:10] at a low level. The encoder 110 receives the first to tenth fuse signals FUSE[1:10] to generate the second skew signal TYPICAL at a high level and the first and third skew signals SLOW and FAST at a low level. The second skew signal TYPICAL is enabled into a high level when three to eight signals of the fuse signals FUSE[1:10] are at a high level.

The second skew signal TYPICAL at a high level turns on the second transfer gate T2 of the delay circuit 20, and the first and third skew signals SLOW and FAST at a low level turn off the first and third transfer gates T1 and T3 of the delay circuit 20. Accordingly, the input signal INPUT inputted to the delay circuit 20 is delayed by the delay interval of the second delay unit 210, and then outputted as the output signal OUTPUT.

In a case in which the third to tenth fuses F3 to F10 are cut, the fuse signal generating circuit 100 generates the first and second fuse signals FUSE[1:2] at a high level and the third to tenth fuse signals FUSE[3:10] at a low level. The encoder 110 receives the first to tenth fuse signals FUSE[1:10] to generate the third skew signal FAST at a high level and the first and second skew signals SLOW and TYPICAL at a low level. The third skew signal FAST is enabled into a high level when two or less signals of the fuse signals FUSE[1:10] are at a high level.

The third skew signal FAST at a high level turns on the third transfer gate T3 of the delay circuit 20, and the first and second skew signals SLOW and TYPICAL at a low level turn off the first and second transfer gates T1 and T2 of the delay circuit 20. Accordingly, the input signal INPUT inputted to the delay circuit 20 is delayed by the delay interval of the third delay unit 220, and then outputted as the output signal OUTPUT.

In the embodiment described above, the semiconductor memory device encodes the fuse signals generated from the fuses that are cut according to skew information obtained through the wafer test, generates the first to third skew signals SLOW, TYPICAL and FAST, which include the skew information, and adjusts the delay intervals of the delay circuit 20 by using the generated skew signals.

According to the embodiment described above, the generated skew signals SLOW, TYPICAL and FAST are used for adjusting the delay intervals of the delay circuit 20. However, the present invention is not limited thereto. That is, the generated skew signals SLOW, TYPICAL and FAST can also be applied to internal circuits of all semiconductor memory devices that perform operations adjusted according to skew information.

Although examples and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application number 10-2007-0141052, filed on Dec. 28, 2007, the entire contents of which are incorporated herein by reference.

What is claimed is:

1. A semiconductor memory device comprising:
    a skew signal generator for generating first to third skew signals including skew information of a wafer based on fuse signals generated from a plurality of fuses; and
    a delay circuit coupled to the skew signal generator for adjusting a delay interval in response to the skew signals,
    wherein the delay circuit comprises:
    a first delay unit for delaying an input signal by a first delay interval;
    a second delay unit for delaying the input signal by a second delay interval;
    a first transfer unit for transferring an output signal of the first delay unit in response to the first skew signal; and
    a second transfer unit for transferring an output signal of the second delay unit in response to the second skew signal.

2. The semiconductor memory device of claim 1, wherein the skew signal generator comprises:
    a fuse signal generating unit including the fuses to generate the fuse signals; and
    an encoder for generating the first to third skew signals including the skew information by encoding the fuse signals.

3. The semiconductor memory device of claim 2, wherein the fuse signal generating unit comprises:
    a first fuse connected between a supply voltage terminal and a first node; and
    a second fuse connected between the supply voltage terminal and a second node,
    wherein a first fuse signal, which is enabled according to whether the first fuse is cut, is output to the first node, and a second fuse signal, which is enabled according to whether the second fuse is cut, is output to the second node.

4. The semiconductor memory device of claim 3, wherein the skew information is obtained through a wafer test, and the first and second fuses are cut according to the skew information obtained through the wafer test.

5. The semiconductor memory device of claim 2, wherein the encoder receives the fuse signals to generate said first to third skew signals enabled according to a number of signals enabled among the fuse signals.

6. The semiconductor memory device of claim 5, wherein the delay circuit further comprises:
    a third delay unit for delaying the input signal by a third delay interval; and
    a third transfer unit for transferring an output signal of the third delay unit in response to the third skew signal.

7. The semiconductor memory device of claim 6, wherein the first to third delay units comprise respective inverter chains.

8. The semiconductor memory device of claim 6, wherein the first delay interval is shorter than the second delay interval and the second delay interval is shorter than the third delay interval.

9. The semiconductor memory device of claim 6, wherein the first to third transfer units comprise respective transfer gates.

* * * * *